US006172631B1

(12) United States Patent
Tsai et al.

(10) Patent No.: US 6,172,631 B1
(45) Date of Patent: Jan. 9, 2001

(54) DOUBLE-SAMPLING PSEUDO-3-PATH BANDPASS SIGMA-DELTA MODULATOR

(75) Inventors: Ruey-Yuan Tsai, Tainan; Shen-Iuan Liu, Keelung; Jing-Shown Wu, Taipei, all of (TW)

(73) Assignee: National Science Council, Taipei (TW)

( * ) Notice: Under 35 U.S.C. 154(b), the term of this patent shall be extended for 0 days.

(21) Appl. No.: 09/241,967

(22) Filed: Feb. 1, 1999

(30) Foreign Application Priority Data

Nov. 5, 1998 (TW) .................................................. 87118455

(51) Int. Cl.[7] ...................................................... H03M 3/00
(52) U.S. Cl. ............................................................. 341/143
(58) Field of Search ................................................ 341/143

(56) References Cited

U.S. PATENT DOCUMENTS 5,982,315 * 11/1999 Bazarjani et al. ..................... 341/143

OTHER PUBLICATIONS

Shen–Iuan Liu; Chien–Hung Kuo; Ruey–Yuan Tsai; Jing-shown Wu ; A double–sampling pseudo–two–path bandpass ΔΣ modulator, IEEE Journal of Solid–State Circuits, vol.: 35 Issue: 2, Feb. 2000; pp.: 276–280.*
A second–order double–sampled delta–sigma modulator using addivtive–error switching; Bumas et al.; IEEE Journal of Solid–State Circuits; vol.: 31 Issue: 3, Mar. 1996; pp.: 284–293.*
Yang et al., A Novel Double Sampling Technique For Delta–Sigma Modulators, Circuits and Systems, 1994., Proceedings of the 37th Midwest Symposuim on Published: 1994., vol. 2, pp.: 1187–1190 vol. 2.
Bang–Sup Song, A Fourth–Order Bandpass Delta–Sigma Modulator With Reduced Number of Op Amps, IEEE Journal of Solid–State Circuits, vol. 30, No. 12, Dec. 1995.
Seyfi Bazarjani and Martin Snelgrove, A 40 MHz Fourth–Order Double–Sampled SC Bandpass ΣΔ Modulator, 1997 IEEE International Symposium on Circuits and Systems, Jun. 9–12, 1997, Hong Kong.
Hong–Kui Yang and Ezz I. El–Masry, Double Sampling Delta–Sigma Modulators, IEEE Transactions on Circuits and Systems–II: Analog and Digital Signal Processing, vol. 43, No. 7, Jul. 1996.
Adrian K. Ong and Bruce A Wooley, A Two–Path Bandpass ΣΔ Modulator for Digital if Extraction at 20 MHz, IEEE Journal of Solid State Circuits, vol. 32, No. 12, Dec. 1997.
Armond Hairapetian, An 81–MHz iF Receiver in CMOS, IEEE Journal of Solid–State Circuits, vol. 31, No. 12, Dec. 1996.

* cited by examiner

Primary Examiner—Howard L. Williams
(74) Attorney, Agent, or Firm—Beyer Weaver & Thomas, LLP

(57) ABSTRACT

Disclosed is a bandpass filter with an input terminal including a sampling circuit for double sampling an input signal from said input terminal, an amplifier, and a conductive connection circuit whose input terminal is coupled to an output of said amplifier, for successively forming three different stages of conductive connection during a time period to form a filtering device with said amplifier. A double sampling bandpass delta-sigma modulator with an input terminal includes two said bandpass filters, a comparator circuit, a multiprocessor, and a feedback circuit which can reduce by half both the required number of amplifiers and the mismatch problems between capacitors and higher frequency operation, and can be easily achieved without additional analog circuits.

16 Claims, 7 Drawing Sheets

DOUBLE-SAMPLING PSEUDO-3-PATH BANDPASS SIGMA-DELTA MODULATOR

BACKGROUND OF THE INVENTION

1. Field of the Invention

The invention relates to a bandpass sigma-delta modulator outputting a bit stream. More particularly, this invention relates to a bandpass sigma-delta modulator that has a double-sampling rate, thereby reducing by half both the number of required amplifiers and the mismatch problems between capacitors. Thus, higher frequency operation can be easily achieved without additional analog circuits.

2. Description of Related Art

In modern wireless communication systems, progress in CMOS technology has made it possible for applications to utilize not only the digital signal process in the baseband, but also the analog signal process in the intermediate frequency (IF) band and the radio frequency (RF) band. Due to the robustness and precision of digital signal processing, however, more functions in the analog domain are being replaced with their equivalent digital counterparts.

In the receiver architectures, IF digitization or performing analog to digital conversion in the IF band overcomes the difficulties of single chip implementation in the superheterodyne receiver, and the problems of DC offset, flicker noise, phase error and I/Q gain mismatch in the direct-conversion receiver.

The bandpass delta-sigma ($\Delta\Sigma$) modulator provides a versatile method of performing analog to digital conversion in the IF. In prior art, the central frequency is usually set as ¼ of sampling rate, and the circuit performance limits the value of sampling rate. Generally, the IF is limited to 5 MHz, which is significantly lower than the standard IF of 10.7 MHz or 21.4 MHz.

SUMMARY OF THE INVENTION

It is accordingly an object of the invention to provide a modulator circuit to raise the central frequency with a double sampling rate in which only one amplifier is needed to realize a $2^{nd}$-order system.

It is an advantage of the invention that the equivalent sampling rate of the circuit is double the sampling rate corresponding to the prior art. In addition, it is not necessary to further enhance the performance of the analog circuit, e.g., by the annexation of extra requirements including clock rate, opamp settling time, do gain, etc. Only one amplifier is required to build a $2^{nd}$-order system applying the pseudo-3-path method of this invention; thus, the number of amplifiers required by the $2^{nd}$-order system of the prior art is reduced. Besides, the forming of circuits by CMOS technology in this invention is of great benefit to the integration of circuits.

First, a double sampling pseudo-3-path bandpass filter is provided in this invention. Then, the above filter is applied to a bandpass delta-sigma modulator to exercise the function of doubling sampling.

Although illustrated and described herein as embodying a double sampling pseudo-3-path bandpass filter and a bandpass delta-sigma modulator, this invention is not intended to be limited to the details shown. Various modifications and structure changes may be made therein without departing from the spirit of the invention and within the scope and the range of equivalents of the claims.

BRIEF DESCRIPTION OF THE DRAWINGS

The construction of the invention, together with additional objects and advantages thereof, will be best understood from the following description of specific embodiments when read in connection with the accompanying drawings.

DETAILED DESCRIPTION OF THE INVENTION

Figure 1:
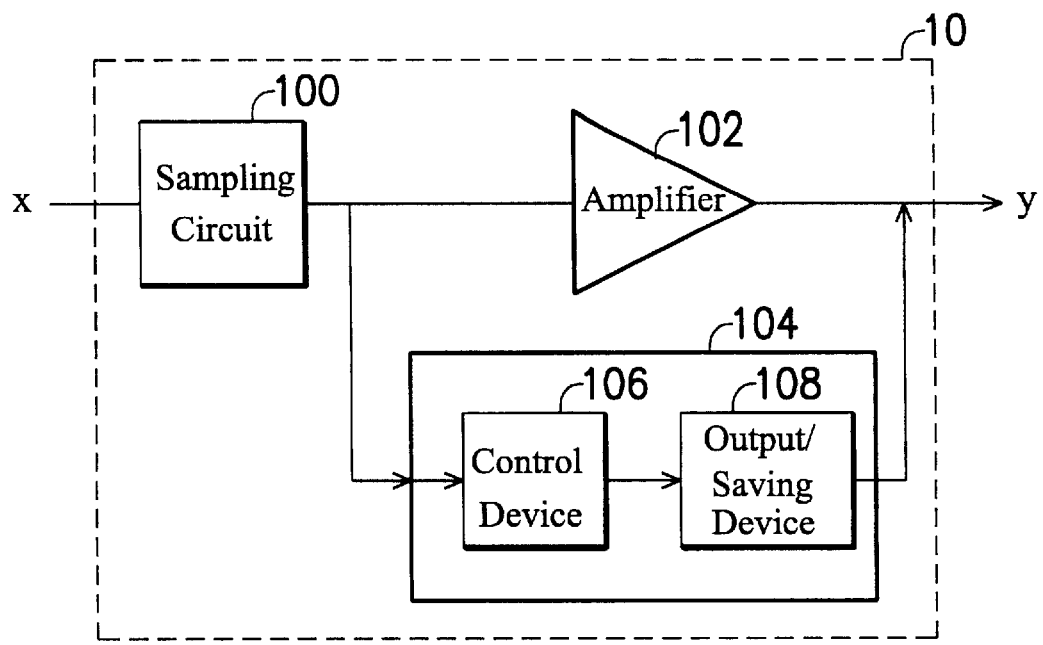
FIG. 1 is a schematic block diagram of the double sampling pseudo-3-path bandpass filter circuit of the first embodiment according to the invention.

Referring to FIG. 1, the first preferred embodiment in accordance with the present invention is schematically depicted in a block diagram. The block 10 representing a double sampling pseudo-3-path bandpass filter circuit according to the invention includes a sampling circuit 100, which receives an input signal x from an input terminal and samples the input signal x with a double sampling rate. The sampled signal from the sampling circuit 100 passes through a filtering device comprising an amplifier 102 and a conductive connection circuit 104, which consists at least of a control device and an output/saving device 108. The output/saving device 108 is controlled by the control device 106 to form three stages of conductive connection on the circuit successively so that an output signal y will be outputted after the output from the sampling circuit 100 passes through the filtering device comprising the amplifier 102 and the conductive connection circuit 104 during one of said three stages of conductive connection.

Figure 2A:
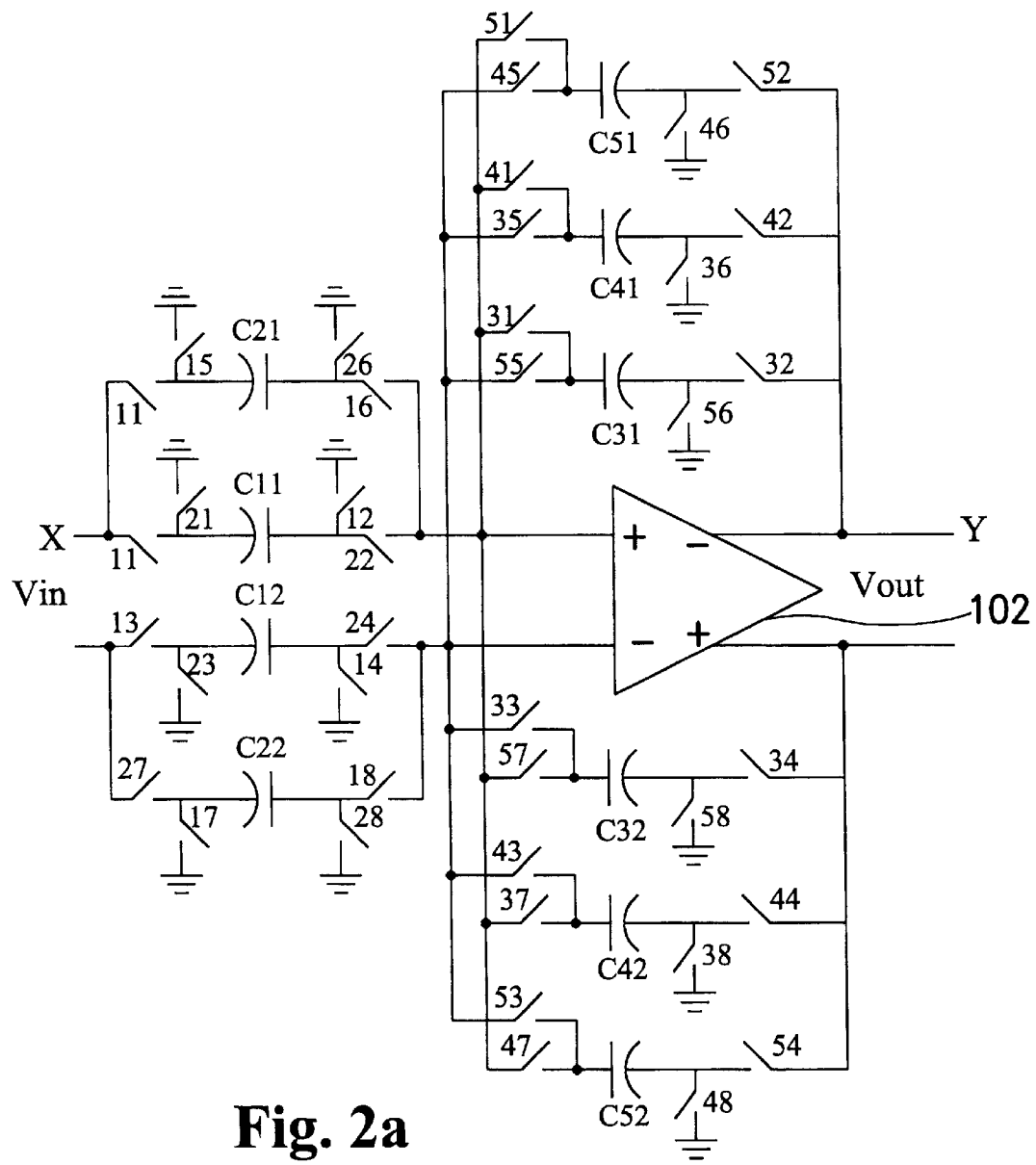
FIG. 2a is a detailed circuit illustration of the double sampling pseudo-3-path bandpass filter circuit of the first embodiment according to the invention.
Figure 2B:
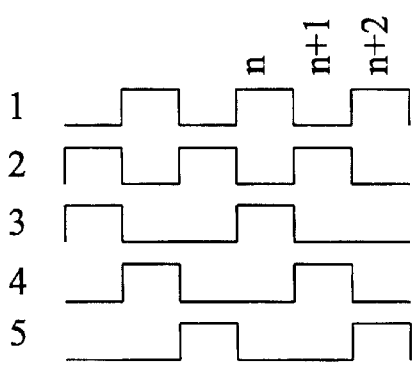
FIG. 2b is a timing diagram of the double sampling pseudo-3-path bandpass filter circuit of the first embodiment according to the invention.

FIG. 2a shows a detailed circuit of the block diagram shown in FIG. 1, and FIG. 2b is a timing diagram related to the circuit in FIG. 2a comprising five clocks. As may be seen in reference to FIG. 2a and FIG. 2b, the elements of the detailed circuit in FIG. 2a with respect to the block 100 in FIG. 1 include a first switch set (11,12, . . . ,18) corresponding to a first clock 1 and a second switch set (21,12, . . . ,28) corresponding to a second clock 2, wherein the first clock 1 and the second clock 2 have the same timing and their pulses do not simultaneously overlap each other; and a first capacitor set (C11,C12), which samples the input signal x while the first clock is HIGH, and a second capacitor set (C21,C22), which samples the input signal x while the second clock is HIGH.

In FIG. 2a, the elements of the detailed circuit with respect to the control device 106 in FIG. 1 include a third switch set (31,32, . . . ,38) corresponding to a third clock, a fourth switch set (41,42, . . . ,48) corresponding to a fourth clock, and a fifth switch set (51,52, . . . ,58) corresponding to a fifth clock, wherein the three clocks have the same timing and their pulses do not simultaneously overlap each other. The output/saving device 108 includes a third capacitor set (C31,C32), a fourth capacitor (C41,C42), and a fifth capacitor (C51,C52), wherein the capacitor sets respectively corresponding to the third clock 3, fourth clock 4, and fifth clock 5 form a $2^{nd}$-order bandpass filter with the amplifier 102 during each stage of conductive connection.

Figure 2C:
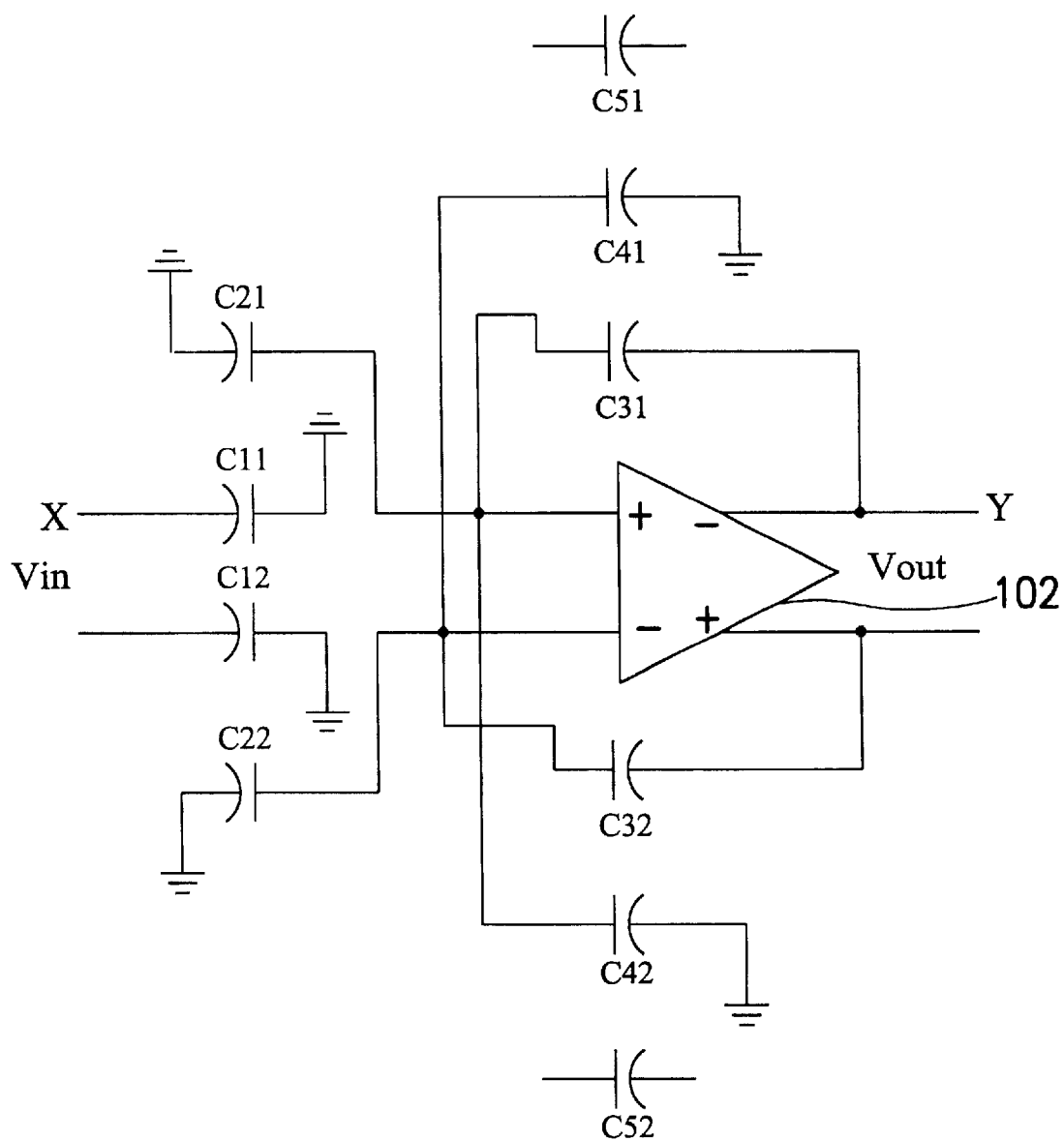
FIG. 2c is a schematic illustration of the double sampling pseudo-3-path bandpass filter circuit of the first embodiment according to the invention, showing the conductive connection on the circuit at time n referred to in FIG. 2b.

FIG. 2c shows the operative circuit in FIG. 2a during the first stage of conductive connection, i.e., at the time n on the timing diagram in FIG. 2b, while the second clock 2, the fourth clock 4, and the fifth clock 5 are LOW and the first clock 1 and the third clock 3 are HIGH. At this time, the second switch set (21,22, . . . ,28), the fourth switch set (41,42, . . . ,48), and the fifth switch set (51,52, . . . ,58) are open and the first switch set (11,12, . . . ,18) and the third switch set (31,32, . . . 38) are closed. Subsequently, the input signal x(n) is sampled to the first capacitor set (C11,C12) while the charge y(n) (i.e., the output signal) in the third capacitor set (C31,C32) is transferred to the fourth capacitor set (C41,C42), the third capacitor set (C31,C32) is clear, and the charge x(n−1)−y(n−2) is transferred between the second capacitor set (C21,C22) and the fourth capacitor set (C41, C42), wherein the charge x(n−1) is being sampled to the second capacitor set (C21,C22) at time n−1 and the charge y(n−2) is being stored in the fourth capacitor set (C41,C42) at time n−2. Hence the charge y(n)=x(n−1)−y(n−2) is stored in the third capacitor set (C31,C32) and the fourth capacitor set (C41,C42) is cleared to zero for storing the electric charge at time n+1.

Figure 2D:
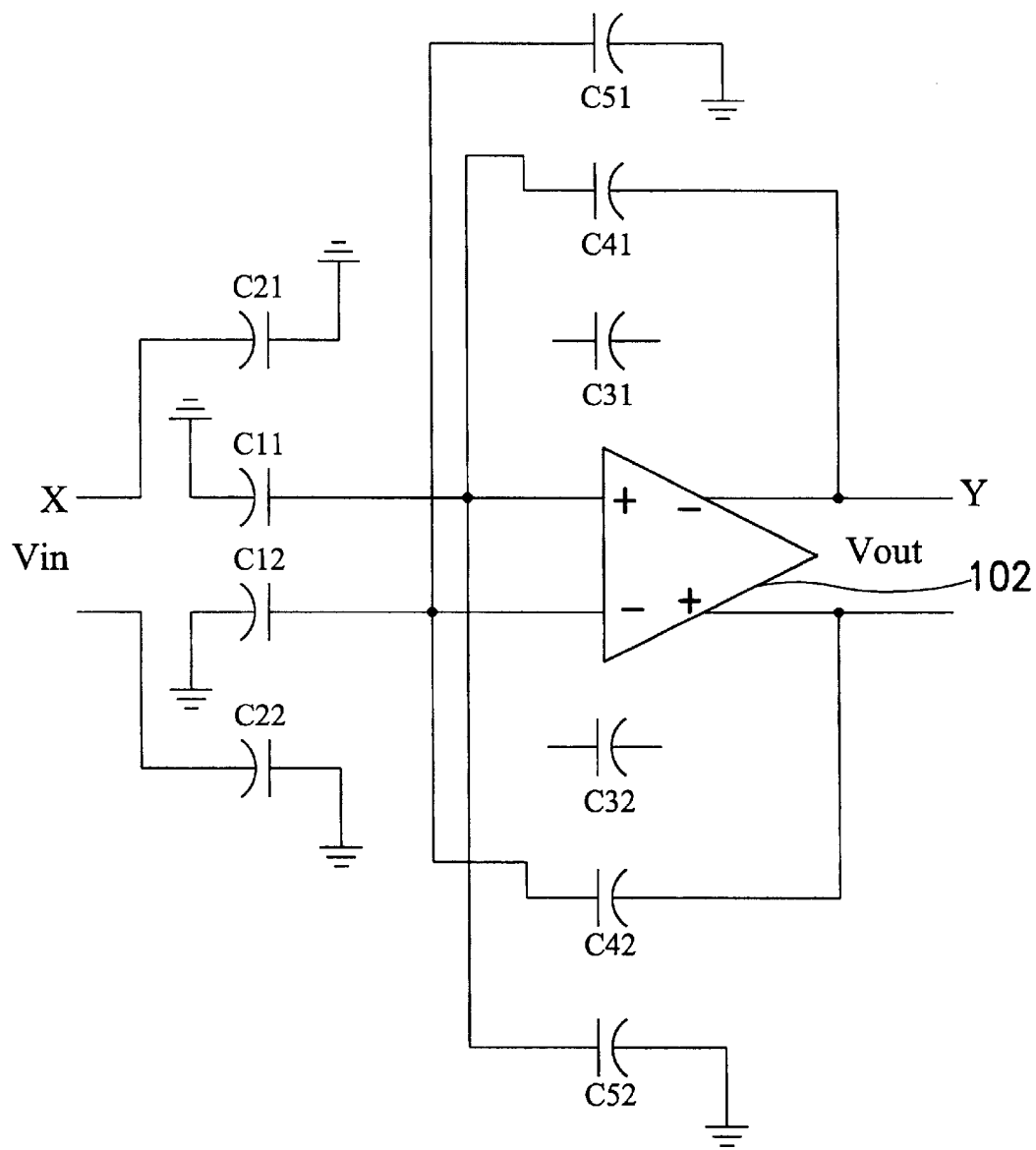
FIG. 2d is a schematic illustration of the double sampling pseudo-3-path bandpass filter circuit of the first embodiment according to the invention, showing the conductive connection on the circuit at time n+1 referred to in FIG. 2b.

FIG. 2d shows the operative circuit in FIG. 2a during the second stage of conductive connection, i.e., at the time n+1 on the timing diagram in FIG. 2b, while the first clock 1, the third clock 3, and the fifth clock 5 are LOW and the second clock 2 and the fourth clock 4 are HIGH. At this time, the first switch set (11,12, . . . ,18), the third switch set (31, 32, . . . ,38), and the fifth switch set (51,52, . . . ,58) are open and the second switch set (21,22, . . . ,28) and the fourth switch set (41,42, . . . ,48) are closed. Subsequently, the input signal x(n+1) is sampled to the second capacitor set (C21, C22) while the charge x(n)−y(n−1) is transferred between the first capacitor set (C11,C12) and the fifth capacitor set (C51,C52), wherein the charge x(n) is being sampled to the first capacitor set (C11,C12) at time n and the charge y(n−1) is being stored in the fifth capacitor set (C51,C52) at time n−1. Hence the charge y(n+1)=x(n)−y(n−1) is stored in the fourth capacitor set (C41,C42) and the fifth capacitor set (C51,C52) is cleared to zero for storing the electric charge at time n+2.

Figure 2E:
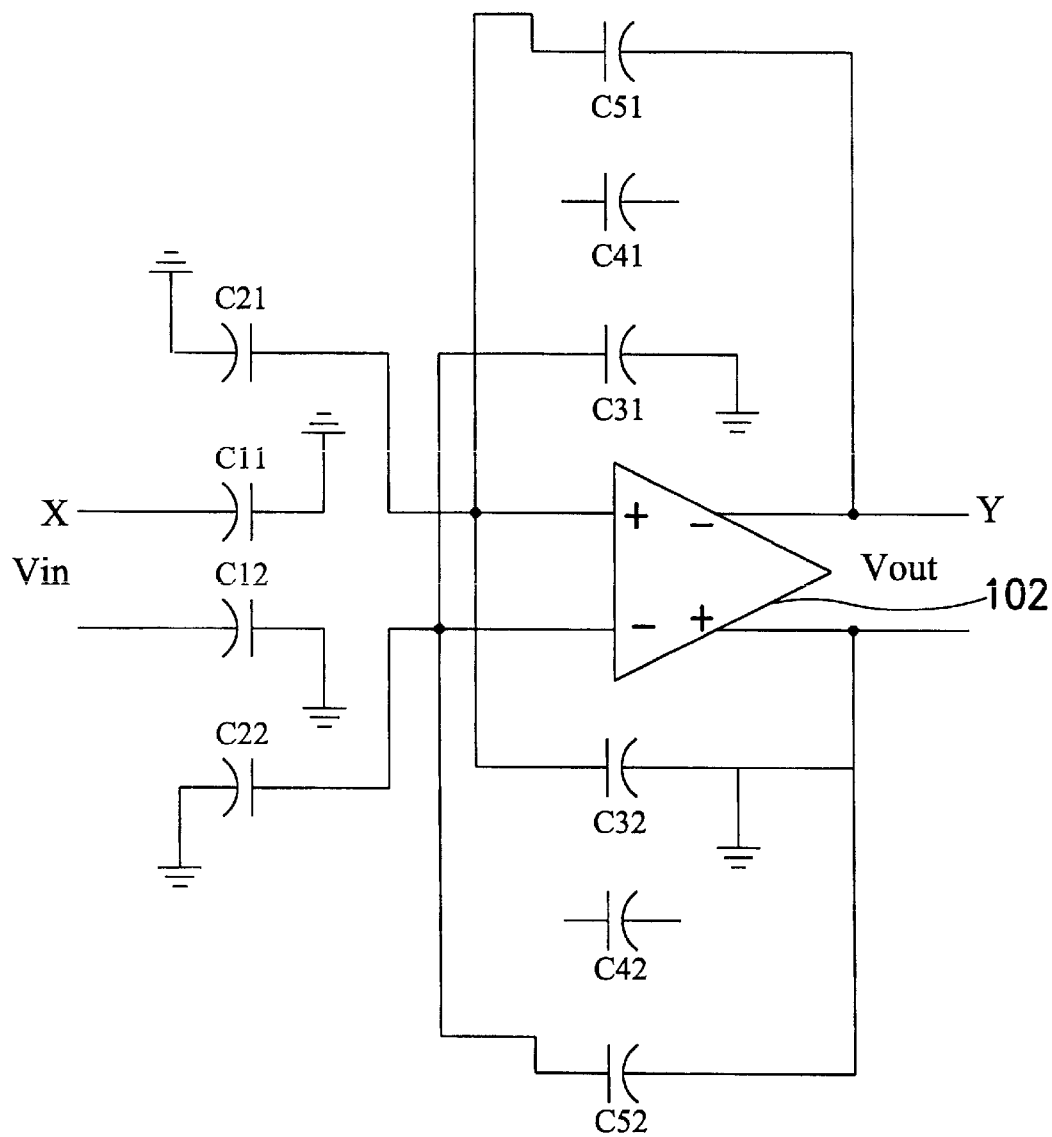
FIG. 2e is a schematic illustration of the double sampling pseudo-3-path bandpass filter circuit of the first embodiment according to the invention, showing the conductive connection on the circuit at time n+2 referred to in FIG. 2b.

Next, in FIG. 2e, during the third stage of conductive connection, i.e., at the time n+2 on the timing diagram in FIG. 2b, while the second clock 2, the third clock 3, and the fourth clock 4 are LOW and the first clock 1 and the fifth clock 5 are HIGH. At this time, the second switch set (21, 22, . . . ,28), the third switch set (31,32, . . . ,38), and the fourth switch set (41,42, . . . ,48) are open and the first switch set (11,12, . . . ,18) and the fifth switch set (51,52, . . . ,58) are closed. Subsequently, the input signal x(n+2) is sampled to the first capacitor set (C11,C12) while the charge x(n+ 1)−y(n) is transferred between the second capacitor set (C21,C22) and the third capacitor set (C31,C32), wherein the charge x(n+1) is being sampled to the second capacitor set (C21,C22) at time n+1 and the charge y(n) is being stored in the third capacitor set (C31,C32) at time n. Hence the charge y(n+2)=x(n+1)−y(n) is stored in the fifth capacitor set (C51, C52) and the third capacitor set (C31,C32) is cleared to zero for storing the electric charge at time n+3.

By the above procedure, the output signal, i.e., the charge y, can be represented as the following mathematical expression at time n+3, n+4, n+5:

$$y(n+3)=x(n+2)-y(n+1),$$

at time n+3;

$$y(n+4)=x(n+3)-y(n+2),$$

at time n+4; and $$y(n+5)=x(n+4)-y(n+3),$$

at time n+5.
The timing (k) comprises a complete circle from time n to time n+5, so the above equations perform equivalently to:

$$y(k)=x(k-1)-y(k-2),$$

where k is an integer and greater than 2 and in which the z-domain transfer function is $z^{-1}/(1+z^{-2})$.

The first embodiment of this invention performs double sampling and operates with only one amplifier for a $2^{nd}$-order system. For other fabricated bandpass filters, the number of amplifiers required is at least two. Since a pseudo-3-path filter is used, the matching problem caused by other filter types is avoided.

Figure 4:
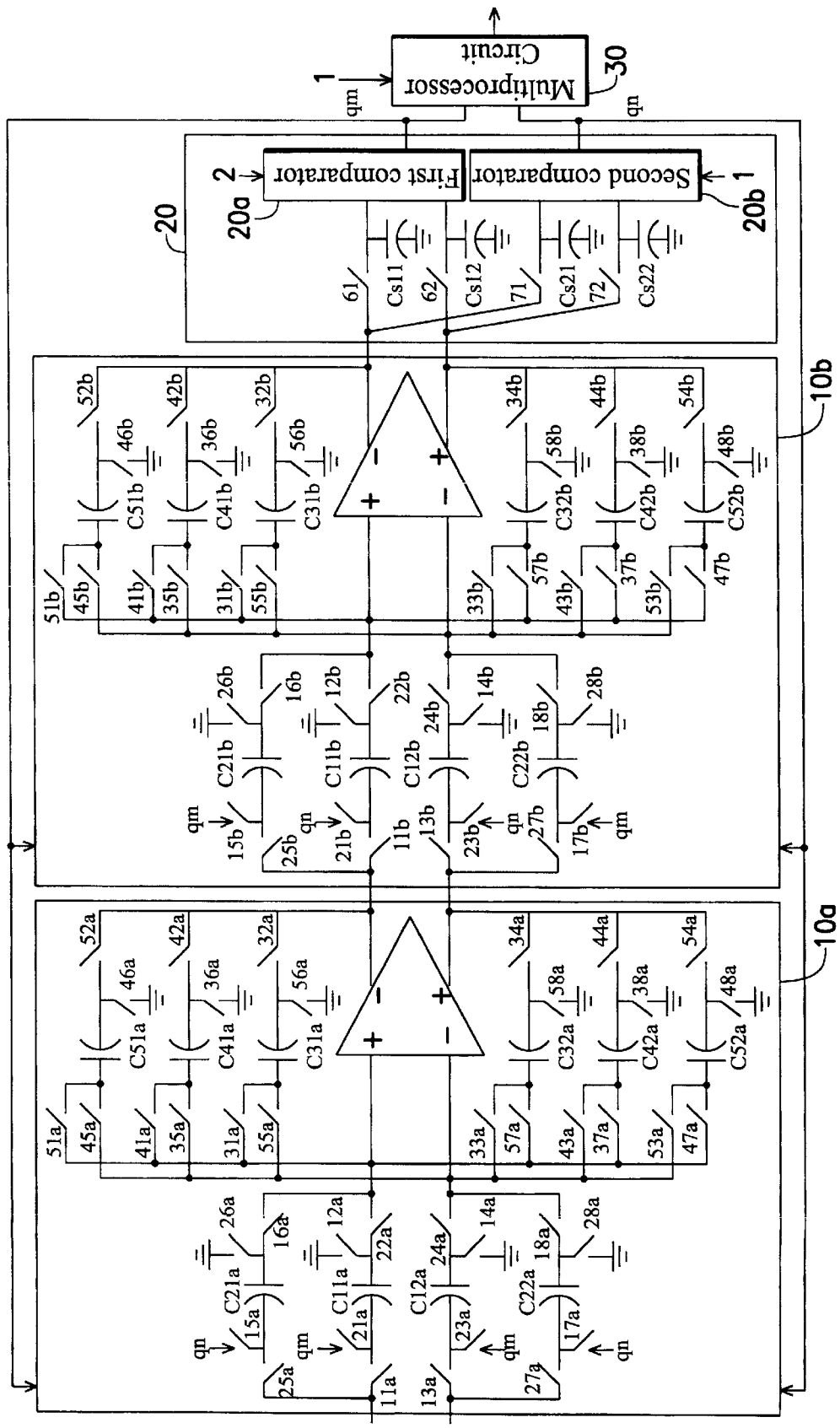
FIG. 4 is a detailed circuit illustration of the $4^{th}$-order double sampling bandpass delta-sigma modulator circuit of the second embodiment according to the invention.

FIG. 4 shows a detailed circuit illustration of a $4^{th}$-order double sampling bandpass delta-sigma modulator circuit of the second embodiment according to the invention, including a first filter 10a and a second filter 10b whose circuits are both similar to the double sampling pseudo-3-path bandpass filter circuit shown in FIG. 2a. An input signal x passes through the first filter 10a performing $2^{nd}$-order bandpass filtering to output an output signal ya. Then the output signal ya passes through the second filter 10b performing the next $2^{nd}$-order bandpass filtering to output an output signal yb. A comparator circuit 20 is applied to compare the yb to output a signal q. A multiprocessor circuit 30 outputs a double sampling bit stream o after receiving q and performing multiprocessing. A feedback circuit 40 is used to feed back the signal q to the first filter 10a or the second filter 10b, alternatively. The function of the feedback circuit 40 is to form a unit delay in the z-domain when the signal ya is sampled by the second filter 10b. Comparing with the prior art, the purpose of forming a unit delay is achieved by appropriately controlling the timing of the feedback to the filters instead of utilizing extra circuits for the unit delay.

FIG. 4 is a detailed circuit illustrating the $4^{th}$-order double sampling bandpass delta-sigma modulator of the second embodiment, wherein the timing is the same as the illustration in FIG. 2b. After signal processing through the first filter 10a and the second filter 10b, the input signal x is transferred to yb. The comparator circuit 20 includes a sixth switch set (61,62) and a seventh switch set (71,72) corresponding to the first clock 1 and the second clock 2, respectively; a sixth capacitor set (C61,C62) and a seventh capacitor set (C71, C72) selectively applied to store the output signal yb from the second filter 10b with respect to the sixth switch set (61,62) and the seven switch set (71,72), respectively; and a first comparator 20a enabled by the second clock 2 to compare the capacitors Cs11 and Cs12, and a second comparator 20b enabled by the first clock 1 to compare the capacitors Cs21 and Cs22. Signals qm and qn with respect to the first comparator 20a and the second comparator 20b are delivered into the multiprocessor 30, which is enabled by the first clock 1.

Figure 3:
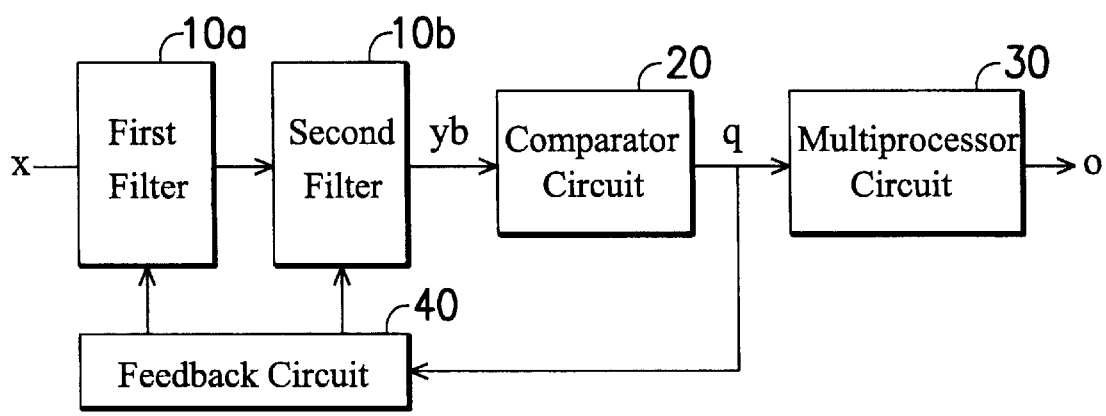
FIG. 3 is a schematic block diagram of a $4^{th}$-order double sampling bandpass delta-sigma modulator circuit of the second embodiment according to the invention.
Figure 5:
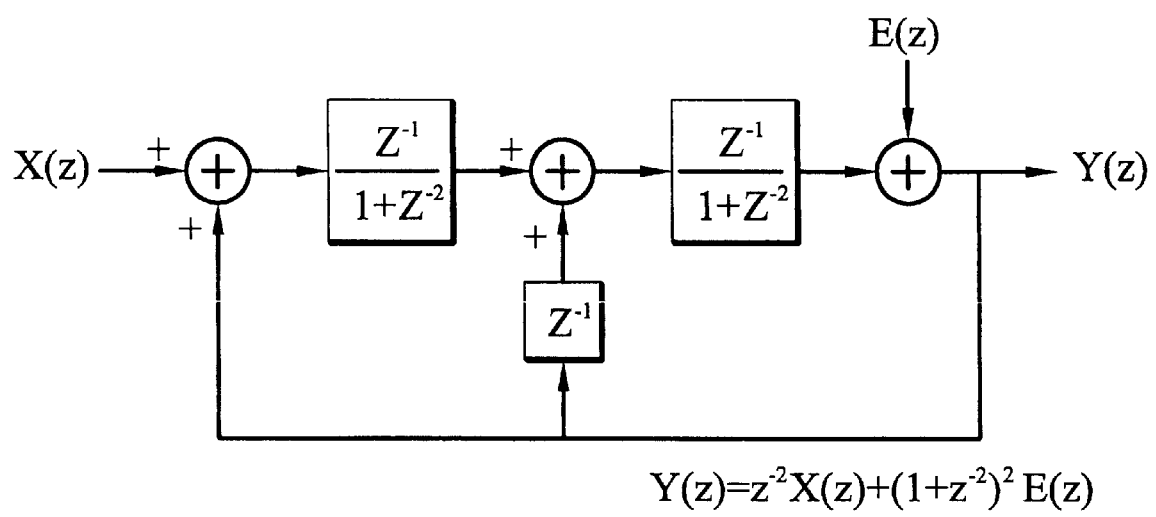
FIG. 5 shows the mathematical model of the block diagram circuit shown in FIG. 3 in z-domain.

FIG. 5 shows the mathematical model of the block diagram circuit shown in FIG. 3 in z-domain, wherein an E(z) is a preset noise signal. Since there are two feedback paths : one with a unit delay $z^{-1}Y(z)$ and the other without a unit delay $z^{-1}Y(z)$, an additional delay circuit is needed. However, due to the double sampling of the second embodiment according to this invention, the unit delay $z^{-1}Y(z)$ in z-domain can be easily realized by appropriately timing control of the feedback signals qm and qn so that the delay circuit is not needed in this invention.

With respect to the feedback circuit 40 in FIG. 3, the feedback signal qm is stored in a first capacitor set (C11a, C12a) of the first filter 10a by switches 21a and 23a and in a second capacitor set (C21b,C22b) of the second filter 10b by switches 15b and 17b, and the feedback signal qn is stored in a second capacitor set (C21a,C22a) of the first filter 10a by switches 15a and 15a and in a first capacitor set (C11b,C12b) of the second filter 10b by switches 21b and 23b. When the first clock 1 is HIGH, the switches 15a and 17a of the first filter 10a and the switches 15b and 17b of the second filter 10b are closed, and the second comparator 20b is enabled to output the feedback signal qn. Since the feedback signal qn is a direct output from the second comparator 20b, there exists no unit delay. It is noted that the first comparator 20a is not enabled at this time. In the contrast, the feedback signal qm is a delayed output for the second filter 10b through the switches 15b and 17b, i.e., qm is the result of the second clock 2 and latched by a latched-comparator, the first comparator 20a. The result is similar when the second clock 2 is HIGH. A mathematical expression is given bellow for the first filter (with un-delayed feedback) at time n to time n+2:

$$y(n)=x(n-1)-y(n-2)+q(n-1),$$

at time n;

$$y(n+1)=x(n)-y(n-1)+q(n),$$

at time n+1; and $$y(n+2)=x(n+1)-y(n)+q(n+1),$$

at time n+2;
and for the second filter (with delayed feedback) at time n to time n+2:

$$y(n)=x(n-1)-y(n-2)+q(n-2),$$

at time n;

$$y(n+1)=x(n)-y(n-1)+q(n-1),$$

at time n; and $$y(n+2)=x(n+1)-y(n)+q(n),$$

at time n.
According to this invention, it can be concluded that for a double sampling delta-sigma modulator, an extra unit delay circuit is not required since there exists a paired of latched comparators.

The foregoing description of preferred embodiments of the present invention has been provided for the purposes of illustration and description. It is not intended to be exhaustive or to limit the invention to the precise forms disclosed. For example, it will be readily appreciated that a complementary conductivity type embodiment may be used. Many modifications and variations will be apparent to practitioners skilled in the art. The embodiments were chosen and described to best explain the principles of the invention and its practical application, thereby enabling others skilled in the art to understand the invention and to practice various other embodiments and make various modifications suited to the particular use contemplated. It is intended that the scope of the invention be defined by the following claims or their equivalents.

What is claimed is:

1. A bandpass filter with an input terminal, including:
    a sampling circuit, coupled to said input terminal for double sampling an input signal from said input terminal;
    an amplifier, whose input terminal is coupled to an output terminal of said sampling circuit; and
    a conductive connection circuit, whose input and output terminals are coupled to the input and output terminals of said amplifier, respectively, for successively forming three different stages of conductive connection during a time period to construct a filtering device with said amplifier.

2. The bandpass filter of claim 1, wherein said sampling circuit is controlled by a first clock and a second clock which do not overlap each other.

3. The bandpass filter of claim 2, wherein said sampling circuit includes:
    a first capacitor set, storing and delivering said input signal to said filtering device when said first clock is HIGH and LOW, respectively; and
    a second capacitor set, storing and delivering said input signal to said filtering device when said second clock is HIGH and LOW, respectively.

4. The bandpass filter of claim 1, wherein said conductive connection circuit includes:
    three output/saving capacitor sets; and
    a control device, for conductively connecting two of said three output/saving capacitor sets to form three different stages of conductive connection during said time period.

5. The bandpass filter of claim 4, wherein said control device is controlled by three clocks which have the same timing and whose pulses do not overlap each other.

6. The bandpass filter of claim 5, wherein said conductive connection circuit includes:
    a third capacitor set;
    a fourth capacitor set;
    a fifth capacitor set; and
    said control device, which conducts said fourth and fifth capacitor set, said third and fifth capacitor set, and said third and fourth capacitor set to form said three stages of conductive connection, respectively.

7. A double sampling bandpass delta-sigma modulator with an input terminal, including:
    a first filter, coupled to said input terminal for receiving an input signal;
    a second filter, coupled to said first filter;
    a comparator circuit, coupled to said second filter for comparing output voltages from said second filter;
    a multiprocessor, coupled to said comparator circuit to output a bit stream; and a feedback circuit, coupled to said comparator circuit and feeding back signals from said comparator selectively to the individual sampling circuit corresponding to said first and second filters; wherein one of said filters includes:

a sampling circuit, coupled to said input terminal for double sampling an input signal from said input terminal;

an amplifier, whose input terminal is coupled to an output terminal of said sampling circuit; and a conductive connection circuit, whose input and output terminals are coupled to the input and output terminals of said amplifier, respectively, for successively forming three different stages of conductive connection during a time period to construct a filtering device with said amplifier.

8. The double sampling bandpass delta-sigma modulator of claim 7, wherein each one of said filters implements a second order system.

9. The double sampling bandpass delta-sigma modulator of claim 7, wherein said sampling circuit is controlled by a first clock and a second clock which do not overlap each other.

10. The double sampling bandpass delta-sigma modulator of claim 9, wherein said sampling circuit includes:

a first capacitor set, storing and delivering said input signal to said filtering device when said first clock is HIGH and LOW, respectively; and a second capacitor set, storing and delivering said input signal to said filtering device when said second clock is HIGH and LOW, respectively.

11. The double sampling bandpass delta-sigma modulator of claim 10, wherein said comparator circuit includes:

a sixth capacitor set, storing outputs of said second filter when said first clock is HIGH;

a first comparator, comparing the voltages of the two capacitors of said sixth capacitor set;

a seventh capacitor set, storing outputs of said second filter when said second clock is HIGH; and a second comparator, comparing the voltages of the two capacitors of said seventh capacitor set.

12. The double sampling bandpass delta-sigma modulator of claim 11, wherein outputs of said comparators pass through said multiprocessor to output said bit stream when said first clock is HIGH.

13. The double sampling bandpass delta-sigma modulator of claim 11, wherein said feedback circuit feeds said output of said first comparator back to said first capacitor set of said first filter and said second capacitor set of said second filter, and said output of said second comparator back to said second capacitor set of said first filter and said first capacitor of said second filter.

14. The double sampling bandpass delta-sigma modulator of claim 7, wherein said conductive connection circuit includes:

three output/saving capacitor sets; and a control device, for conductively connecting two of said three output/saving capacitor sets to form three different stages of conductive connection during said time period.

15. The double sampling bandpass delta-sigma modulator of claim 14, wherein said control device is controlled by three clocks which have the same timing and whose pulses do not overlap each other.

16. The double sampling bandpass delta-sigma modulator of claim 15, wherein said conductive connection circuit includes:

a third capacitor set;

a fourth capacitor set;

a fifth capacitor set; and said control device, which conducts said fourth and fifth capacitor set, said third and fifth capacitor set, and said third and fourth capacitor set to form said three stages of conductive connection, respectively.

* * * * *